(12) United States Patent
Murphy

(10) Patent No.: US 12,015,344 B2
(45) Date of Patent: Jun. 18, 2024

(54) PEAK CURRENT MODE CONTROLLER

(71) Applicant: Raytheon Systems Limited, Harlow (GB)

(72) Inventor: Francis William Murphy, Glenrothes Fife (GB)

(73) Assignee: Raytheon Systems Limited, Harlow (GB)

(*) Notice: Subject to any disclaimer, the term of this patent is extended or adjusted under 35 U.S.C. 154(b) by 184 days.

(21) Appl. No.: 17/766,085

(22) PCT Filed: Sep. 30, 2020

(86) PCT No.: PCT/GB2020/052371
§ 371 (c)(1),
(2) Date: Apr. 1, 2022

(87) PCT Pub. No.: WO2021/064373
PCT Pub. Date: Apr. 8, 2021

(65) Prior Publication Data
US 2022/0368226 A1 Nov. 17, 2022

(30) Foreign Application Priority Data
Oct. 2, 2019 (GB) .................................... 1914231

(51) Int. Cl.
 *H02M 3/157* (2006.01)
 *H02M 1/00* (2006.01)
 *H02M 1/08* (2006.01)

(52) U.S. Cl.
 CPC ......... *H02M 3/157* (2013.01); *H02M 1/0009* (2021.05); *H02M 1/08* (2013.01)

(58) Field of Classification Search
 CPC ....... H02M 3/157; H02M 1/0009; H02M 1/08
 See application file for complete search history.

(56) References Cited

U.S. PATENT DOCUMENTS 8,912,938 B1  12/2014  Lu et al.
9,379,621 B1* 6/2016  Kalyanaranman ........................... H02M 3/33507

(Continued)

OTHER PUBLICATIONS

International Preliminary Report on Patentability in Application No. PCT/GB2020/052371 dated Apr. 14, 2022 (12 pages).

(Continued)

*Primary Examiner* — Rafael O Leon De Domenech

(57) ABSTRACT

A peak current mode 'PCM' controller comprising control logic arranged to produce a series of digital control values derived from a voltage sense signal, control logic arranged to produce a digital slope compensation value, a first digital to analogue converter 'DAC' arranged to receive the series of digital control values and output a corresponding analogue control voltage, a second DAC arranged to receive the digital slope compensation value and output a corresponding analogue slope compensation voltage, an analogue differential integrator arranged to receive the analogue control voltage and the analogue slope compensation voltage, integrate the analogue slope compensation voltage, subtract the integrated slope compensation voltage from the analogue control voltage, and output the result of the subtraction as an analogue output voltage, a comparator arranged to compare the analogue output voltage to a voltage of an analogue current sense signal and produce an output signal when the analogue current sense signal voltage is equal to or exceeds the analogue output voltage, and control logic arranged to produce a drive signal in response to the output signal.

33 Claims, 2 Drawing Sheets

(56) References Cited

U.S. PATENT DOCUMENTS

| | | | | |
|---|---|---|---|---|
| 10,715,039 | B1* | 7/2020 | Ilango | G01R 19/175 |
| 10,720,835 | B2* | 7/2020 | King | H02M 3/157 |
| 11,463,008 | B2* | 10/2022 | Mackay | H02M 3/158 |
| 2011/0204859 | A1* | 8/2011 | Prodic | H02M 3/1588 |
| | | | | 323/271 |
| 2014/0266116 | A1 | 8/2014 | Henzler et al. | |
| 2014/0247029 | A1* | 9/2014 | Krabbenborg | H02M 3/156 |
| | | | | 323/282 |
| 2019/0089245 | A1* | 3/2019 | King | G05F 1/46 |
| 2019/0157974 | A1 | 5/2019 | Tomita et al. | |
| 2019/0181754 | A1 | 6/2019 | Ash et al. | |
| 2019/0386561 | A1* | 12/2019 | King | H02M 1/42 |
| 2020/0083794 | A1 | 3/2020 | Bhandarkar et al. | |
| 2021/0083578 | A1* | 3/2021 | King | H02M 3/156 |

OTHER PUBLICATIONS

International Search Report in Application No. PCT/GB2020/052371 dated Jan. 15, 2021 (3 pages).

Poley et al., "Digital Peak Current Mode Control With Slope Compensation Using the TMS320F2803x," Texas Instruments, Application Report, SPRABE7A, Apr. 2012, 27 pages.

Sampath, "Digital Peak Current Mode Control of Buck Converter Using MC56F8257 DSC," Freescale Semiconductor Application Note, Document No. AN4716, May 2013, 22 pages.

Taeed et al., "High-performance digital replica of analogue peak current mode control for DC-DC converter," IET Power Electronics Research Article, Mar. 2016, 8 pages.

* cited by examiner

PEAK CURRENT MODE CONTROLLER

CROSS REFERENCE TO RELATED APPLICATIONS

This is a National Stage Application filed under 35 U.S.C. 371 based on International Patent Application No. PCT/GB2020/052371, filed on Sep. 30, 2020, which claims priority to Great Britain Patent Application No. 1914231.4, filed on Oct. 2, 2019, the disclosures of both of which are incorporated herein by reference in their entireties.

The present application relates to a peak current mode controller, a system comprising the controller, and a corresponding method.

BACKGROUND

Peak Current Mode (PCM) control is commonly used to control power supply systems. A known method of digital implementation of PCM control uses a Digital to Analogue Converter (DAC) to provide an analogue signal to a comparator. A problem with this approach is that the DAC must be high resolution and run at a very fast speed in order to avoid quantisation effects and provide acceptably accurate and stable control. This is particularly a problem in architectures where the digital control processing is provided by a logic processor and the DAC is a separate component. The required high resolution fast DAC may be relatively expensive, and require voltage buffering and a large number of parallel high speed in/out lines, leading to difficulties in layout and digital isolation.

The embodiments described below are not limited to implementations which solve any or all of the disadvantages of the known approaches described above.

SUMMARY

This Summary is provided to introduce a selection of concepts in a simplified form that are further described below in the Detailed Description. This Summary is not intended to identify key features or essential features of the claimed subject matter, nor is it intended to be used to determine the scope of the claimed subject matter; variants and alternative features which facilitate the working of the invention and/or serve to achieve a substantially similar technical effect should be considered as falling into the scope of the invention disclosed herein.

The present disclosure provides a peak current mode (PCM) controller, system and method, in which an analogue control voltage and an analogue slope compensation voltage of an outer voltage control loop are provided to an analogue differential integrator arranged to: receive the analogue control voltage and the analogue slope compensation voltage; integrate the analogue slope compensation voltage; subtract the integrated slope compensation voltage from the analogue control voltage; and output the result of the subtraction as an analogue output voltage for use as a threshold level by a inner current control loop.

In a first aspect, the present disclosure provides a peak current mode 'PCM' controller comprising: control logic arranged to produce a series of digital control values derived from a voltage sense signal; control logic arranged to produce a digital slope compensation value; a first digital to analogue converter 'DAC' arranged to receive the series of digital control values and output a corresponding analogue control voltage; a second DAC arranged to receive the digital slope compensation value and output a corresponding analogue slope compensation voltage; an analogue differential integrator arranged to: receive the analogue control voltage and the analogue slope compensation voltage; integrate the analogue slope compensation voltage; subtract the integrated slope compensation voltage from the analogue control voltage; and output the result of the subtraction as an analogue output voltage; a comparator arranged to compare the analogue output voltage to a voltage of an analogue current sense signal and produce an output signal when the analogue current sense signal voltage is equal to or exceeds the analogue output voltage; and control logic arranged to produce a drive signal in response to the output signal.

In a second aspect, the present disclosure provides a power supply system comprising a power supply device and a peak current mode 'PCM' controller, the power supply device comprising a switch; and the peak current mode 'PCM' controller comprising: control logic arranged to produce a series of digital control values derived from a voltage sense signal corresponding to an output voltage of the power supply device; control logic arranged to produce a digital slope compensation value; a first digital to analogue converter 'DAC' arranged to receive the series of digital control values and output a corresponding analogue control voltage; a second DAC arranged to receive the digital slope compensation value and output a corresponding analogue slope compensation voltage; an analogue differential integrator arranged to: receive the analogue control voltage and the analogue slope compensation voltage; integrate the analogue slope compensation voltage; subtract the integrated slope compensation voltage from the analogue control voltage; and output the result of the subtraction as an analogue output voltage; a comparator arranged to compare the analogue output voltage to a voltage of an analogue current sense signal corresponding to an input current of the power supply device and produce an output signal when the analogue current sense signal voltage is equal to or exceeds the analogue output voltage; and control logic arranged to produce a drive signal opening the switch in response to the output signal.

In a third aspect, the present disclosure provides a method of operating a peak current mode 'PCM' controller, the method comprising: producing a series of digital control values derived from a voltage sense signal by a control logic; producing a digital slope compensation value by a control logic; receiving the series of digital control values at a first digital to analogue converter 'DAC' and outputting a corresponding analogue control voltage from the first DAC; receiving the digital slope compensation value at a second DAC and outputting a corresponding analogue slope compensation voltage from the second DAC; receiving the analogue control voltage and the analogue slope compensation voltage at an analogue differential integrator; the analogue differential integrator integrating the analogue slope compensation voltage; the analogue differential integrator subtracting the integrated slope compensation voltage from the analogue control voltage; and the analogue differential integrator outputting the result of the subtraction as an analogue output voltage; comparing the analogue output voltage to a voltage of an analogue current sense signal at a comparator and producing an output signal when the analogue current sense signal voltage is equal to or exceeds the analogue output voltage; and producing a drive signal by a control logic in response to the output signal.

The methods described herein may be performed in part by software in machine readable form on a tangible storage medium e.g. in the form of a computer program comprising computer program code means adapted to perform all the steps of any of the methods described herein when the program is run on a computer and where the computer program may be embodied on a computer readable medium. Examples of tangible (or non-transitory) storage media include disks, thumb drives, memory cards etc. and do not include propagated signals. The software can be suitable for execution on a parallel processor or a serial processor such that the method steps may be carried out in any suitable order, or simultaneously.

This application acknowledges that firmware and software can be valuable, separately tradable commodities. It is intended to encompass software, which runs on or controls "dumb" or standard hardware, to carry out the desired functions. It is also intended to encompass software which "describes" or defines the configuration of hardware, such as HDL (hardware description language) software, as is used for designing silicon chips, or for configuring universal programmable chips, to carry out desired functions.

The preferred features may be combined as appropriate, as would be apparent to a skilled person, and may be combined with any of the aspects of the invention.

BRIEF DESCRIPTION OF THE DRAWINGS

Embodiments of the invention will be described, by way of example, with reference to the following drawings, in which.

DETAILED DESCRIPTION

Embodiments of the present invention are described below by way of example only. These examples represent the best mode of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

Figure 2:
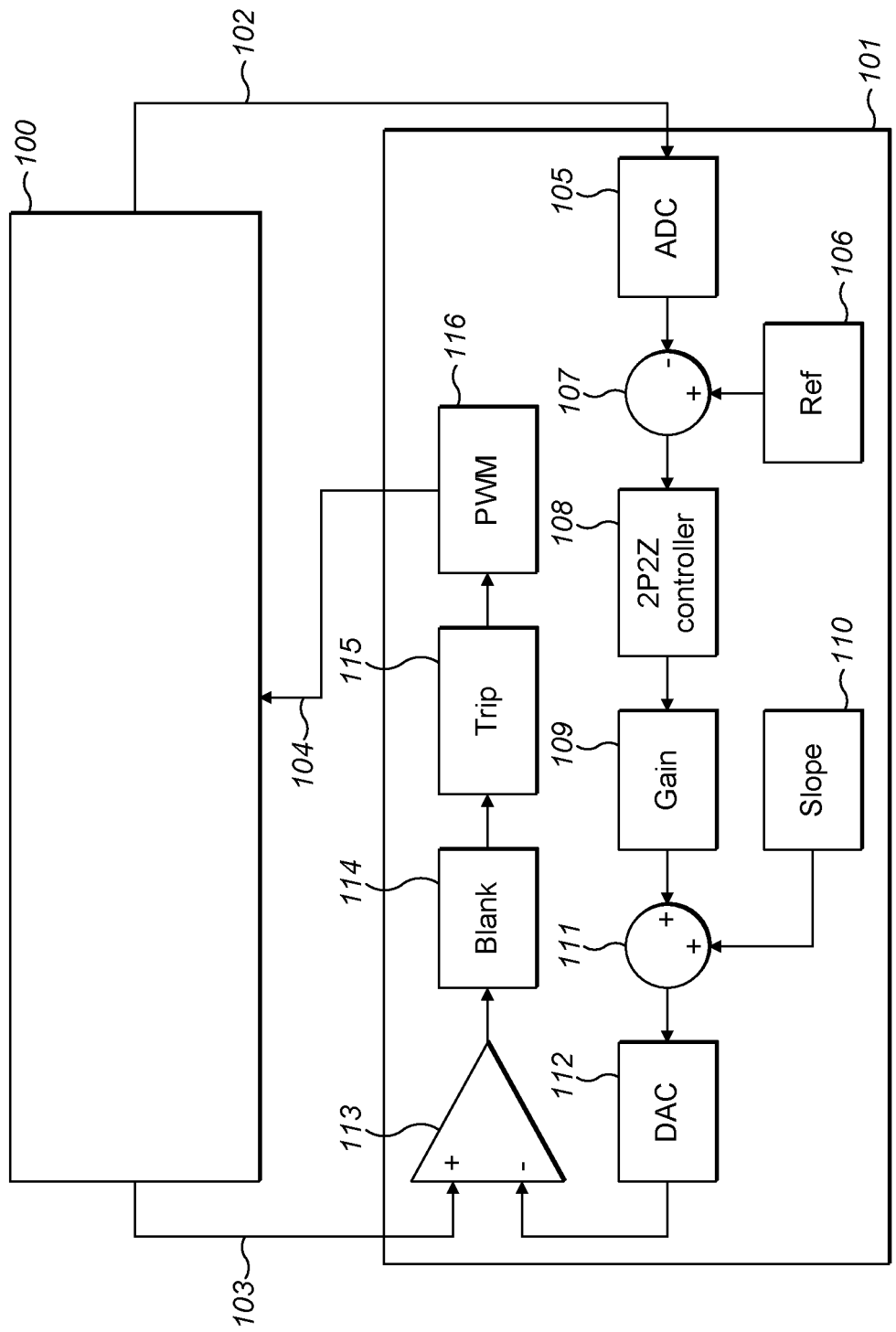
FIG. 2 is a schematic explanatory diagram illustrating a known peak current mode controller.

FIG. 2 is a schematic diagram illustrating a buck converter 100 controlled by a known digital peak current mode (PCM) controller 101. In the example of FIG. 2 the PCM controller 101 receives a voltage signal 102 and a current signal 103 from the buck converter 100, and uses these to produce a gate drive signal 104, which is used to control a gate of the buck converter 100. The PCM controller 101 forms an outer voltage control loop and an inner current control loop.

As shown in FIG. 2, in the PCM controller 101 the received analogue voltage signal 102 is supplied to an analogue to digital converter (ADC) 105. A reference value 106 is then subtracted from the digitised output value of the ADC 105 in a summer 107, and the output of the summer is supplied to a digital controller 108. The digital controller 108 may be a double pole double zero (2p2z) controller. The output of the digital controller 108 is multiplied by a gain term K in a multiplier 109, and the output of the multiplier 109 is added to a slope compensation value 110 by a summer 111.

The output of the summer 111 is then supplied to a digital to analogue converter (DAC) 112, and the analogue output of the DAC 112 is compared to the received analogue current signal 103 by a comparator 113.

The output of the comparator 113 is subject to blanking by a blanking element 114, and the resulting blanked signal is then provided to a cycle-by-cycle trip element 115. The output of the cycle-by-cycle trip element 115 is used to control a pulse width modulation (PWM) element 116, which produces the gate drive control signal 104 which is sent to the buck converter 100.

In the PCM controller 101 of FIG. 2, the DAC 112 is required to accurately construct an analogue waveform from the digital signal output by the summer 111 combining the gain adjusted output from the controller 108 and the slope compensation 110, which analogue waveform is to be compared to the analogue current signal 103 by the comparator 113.

The output of the DAC 112 is quantised because the analogue output of the DAC 112 can only change as quickly as the DAC 112 can process a digital input value, typically limited by factors such as output settling time, conversion time, clock speed, and the number of clock cycles required to process a digital value, depending on the design of the DAC 112, and this analogue output can only be at analogue values corresponding to digital values which the DAC 112 is able to receive as an input and process. This quantisation can give rise to problems if the changes to successive analogue output values of the DAC 112 are too slow and/or too large. One possible problem is that if the minimum change between successive analogue output values of the DAC 112 is too large these quantisation effects can cause the PCM controller 101 and the buck converter 100 to enter a bistable mode where the On time of the buck converter 100 oscillates between two or more values and does not provide a desired output.

In some real-world examples the DAC 112 may require a resolution of 12 bits or more and may require a sampling rate of 100 million samples per second (100 MS/s) or higher. Such a DAC may require 100 mm$^2$ or more of board space and will require at least 14 I/O lines running at more than 100 Mb/s, leading to problems in layout and digital isolation of the DAC.

These problems are particularly severe in architectures where the digital control logic or control processing is provided by a logic controller, such as an FPGA controller chip, and the analogue circuit elements, for example ADCs, DACs, and/or comparators, are provided as separate components. Without wishing to be bound by theory, these problems are believed to be particularly severe in architectures of this type at least because the distances between the circuit elements is greater. However, it may be desirable to use such architectures in some applications.

Figure 1:
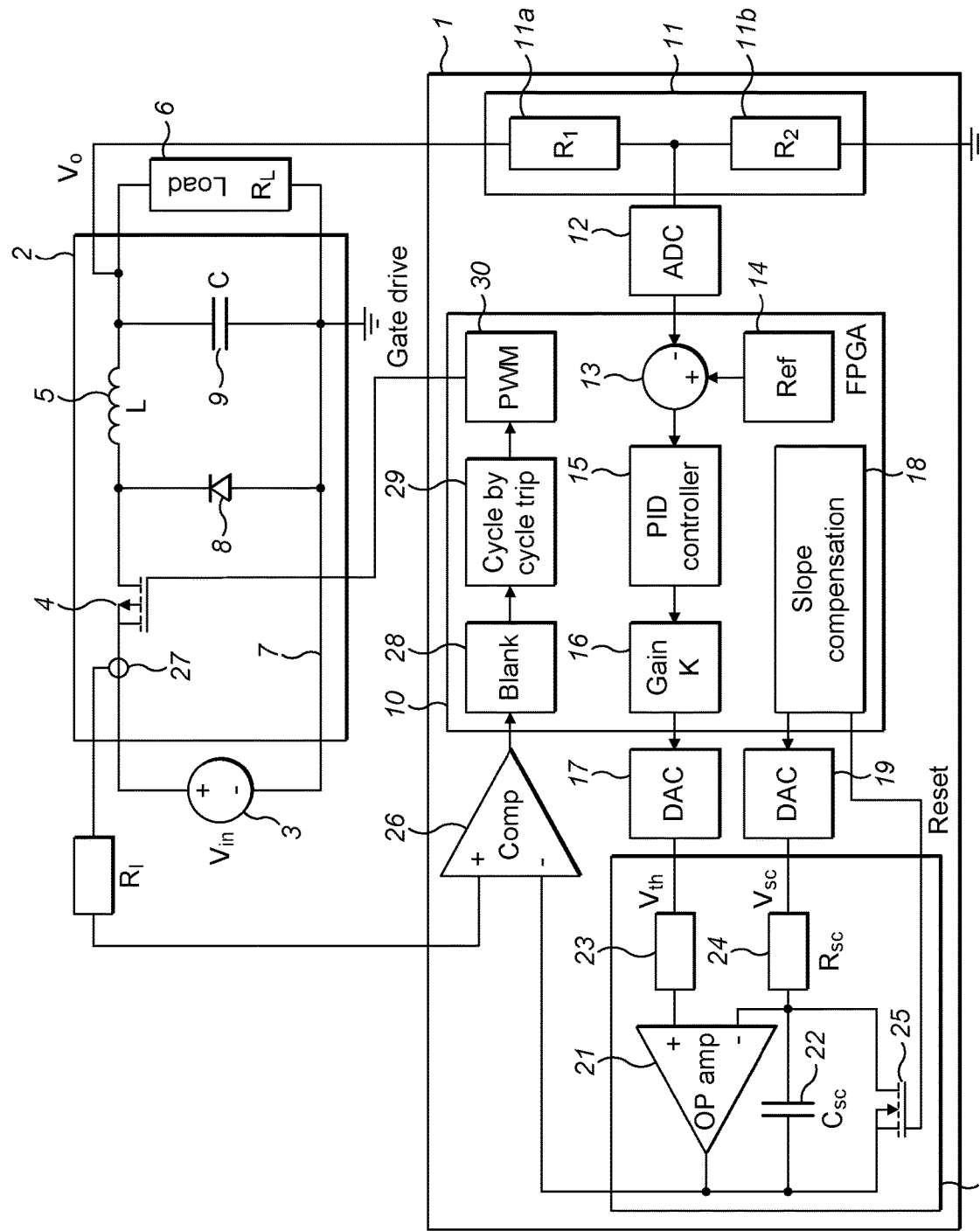
FIG. 1 is a schematic diagram illustrating a peak current mode controller according to a first embodiment of the invention.

FIG. 1 is a schematic diagram illustrating an embodiment of a digital peak current mode (PCM) controller 1 according to the present invention applied to a buck converter 2. In FIG. 1 the PCM controller 1 is shown as a functional block diagram.

In FIG. 1, a PCM controller 1 is arranged to control a buck converter 2. A buck converter is a DC to DC power converter which steps down (decreases) an input voltage from an input power supply to a lower output voltage to a load, and at the same time steps up (increases) an input current from an input power supply to a higher output current to a load.

An overview of the operation of the PCM controller 1 is that the PCM controller 1 generates a gate control signal to control operation of the buck converter 2. This gate control signal switches a switch of the buck converter 2 on at a constant frequency. Accordingly, the buck converter 2 operates cyclically at this constant frequency. During each cycle of the buck converter 2 the gate control signal switches a switch of the buck converter 2 off when the inductor current flowing into an inductor of the buck converter 2 from a power supply reaches a threshold level defined by a controller and a compensation slope. Accordingly, the PCM controller receives a voltage sense signal indicating the output voltage provided to a load by the buck converter 2 and a current sense signal indicating the input current from the input power supply of the buck converter 2 to an inductor of the buck converter 2. The PCM controller 1 comprises control logic defining a dual loop control system in which the voltage sense signal and the current sense signal are respectively used to form an outer voltage control loop and an inner current control loop of the dual loop control system to generate a gate control signal to control operation of the buck converter 2. The compensation slope, which may also be referred to as a compensation ramp, is used to prevent sub-harmonic oscillation of the buck converter 2, as is well known in the field of power supply control.

As shown in FIG. 1, the buck converter 2 is connected to a DC power source 3 and a load 6. The DC power source 3 produces an input voltage $V_{in}$, and has a positive terminal connected to a MOSFET 4 of the buck converter 2. The MOSFET 4 is the switch of the buck converter 2 receiving the gate control signal from the PCM controller 1. The DC power source 3 is connected to a source terminal of the MOSFET 4. A first end of an inductor 5 of the buck converter 2 is connected to a drain terminal of the MOSFET 4, and a second end of the inductor 5 is coupled to first end of the load 6. The second end of the load 6 is connected to a negative terminal of the DC power source 3 through an earth rail 7 of the buck converter 2. The first end of the inductor 5 is connected to the earth rail 7 (and thus to the negative terminal of the DC power source 3) through a diode 8 of the buck converter 2, and the second end of the inductor 5 is connected to the earth rail 7 (and thus to the negative terminal of the DC power source 3) through a capacitor 9 of the buck converter 2.

A gate of the MOSFET 4 is connected to the PCM controller 1 whereby the PCM controller 1 can provide a gate control signal to the gate of the MOSFET 4 to control operation of the buck converter 2.

In the embodiment of FIG. 1 a buck converter is used by way of example only. The present invention may be used with any power supply device topology or other device suitable to be operated using PCM control. Examples of suitable power supply device topologies include switched mode power supplies and/or power converters, such as buck converters, boost converters, buck-boost converters, push-pull converters, flyback converters, and forward converters, or any other suitable device topology. This list is by way of example only and is not intended to be exhaustive.

The PCM controller 1 comprises digital control logic provided in a suitable programmed field programmable gate array (FPGA) 10, and a number of non-logic discrete components separate from the digital control logic of the FPGA 10, as will be discussed in more detail below. The digital control logic of the FPGA 10 is described in terms of a number of functional modules in the below description.

An output voltage $V_o$ of the buck converter 2 is taken from the first end of the load 6 of the buck converter 2 and is provided as a voltage sense signal to the PCM controller 1.

The PCM controller 1 comprises a resistive sampling divider network 11, and the received voltage sense signal is applied to the resistive sampling divider network 11. The resistive sampling divider network 11 comprises first and second resistors 11a and 11b arranged in series. The voltage sense signal is applied to a first end of the resistive sampling divider network 11 and a second end of the resistive sampling divider network 11 is earthed. As shown in FIG. 1, the resistive sampling divider network 11 is separate from the FPGA 10.

An analogue to digital converter (ADC) 12 is arranged to sample voltage values from the resistive sampling divider network 11 at a point between the first and second resistors 11a and 11b, and to convert these analogue voltage values into a series of digital voltage values. As shown in FIG. 1, the ADC 12 is separate from the FPGA 10.

The digital voltage values produced by the ADC 12 are provided to a summer module 13 of the FPGA 10. A digital reference value is also provided to the summer module 13 by a reference module 14 of the FPGA 10. The summer module 13 subtracts the digital reference value from each of the digital voltage values from the ADC 12 to produce a series of digital error values. The reference value corresponds to a desired output voltage of the buck converter 2, so that the digital error values output by the summer module 13 are error values corresponding to the difference between this desired output voltage and the actual output voltage $V_o$ of the buck converter 2.

The digital error values output by the summer module 13 are provided to a controller module 15 of the FPGA 10. In the illustrated example of FIG. 1 the controller module 15 is a proportional-integral-derivative (PID) controller, but other controllers may be used. The type and functionality of the controller module 15 may be selected as appropriate based on the type and topology of the controlled device. In the illustrated example of FIG. 1 where the controlled device is a buck converter the controller module 15 may, for example, be a double pole double zero (2p2z) controller. However, other controllers may alternatively be used.

The controller module 15 produces digital control values which are provided to a gain module 16 of the FPGA 10, which multiplies the digital control values by a gain term K to produce scaled digital control values, which are output from the FPGA 10. The scaled digital control values of the gain module 16 are input to a first digital to analogue converter (DAC) 17, which converts them into an analogue control voltage $V_{th}$. As shown in FIG. 1, the first DAC 17 is separate from the FPGA 10.

The gain term K used by the gain module 16 is selected to scale the possible range of values of the scaled digital control values to suitable values for input to the first DAC 17. Accordingly, the gain term K may be selected based on the properties and parameters of the resistive sampling divider network 11, the ADC 12, the summer module 13, the controller module 15, and the first DAC 17.

A slope compensation module 18 of the FPGA 10 produces a digital slope compensation value which is output from the FPGA 10. The digital slope compensation value from the slope compensation module 18 is input to a second digital to analogue converter (DAC) 19, which converts it into an analogue slope compensation voltage $V_{sc}$. The slope compensation module 18 of the FPGA 10 is also arranged to selectively produce a reset signal. As shown in FIG. 1, the second DAC 18 is separate from the FPGA 10.

The analogue control voltage $V_{th}$ from the first DAC 17 and the analogue slope compensation voltage $V_{sc}$ from the second DAC 19 are provided to an OpAmp integrator 20 formed by an operational amplifier 21, a capacitor 22, a third resistor 23 and a fourth resistor 24. In the OpAmp integrator 20, the analogue control voltage $V_{th}$ from the first DAC 17 is provided to a non-inverting input of the operational amplifier 21 through the first resistor 23, and the analogue slope compensation voltage $V_{sc}$ from the second DAC 19 is provided to an inverting input of the operational amplifier 21 through the first resistor 23. The capacitor 22 is connected between the inverting input of the operational amplifier 21 and the output of the operational amplifier. The OpAmp integrator 20 is separate from the FPGA 10.

The OpAmp integrator 20 further comprises a MOSFET 25 connected across the capacitor 22, that is, with the drain terminal and source terminal of the MOSFET 25 connected to opposite sides of the capacitor 22. A gate terminal of the MOSFET 25 is connected to the slope compensation module 18 so that the reset signal from the slope compensation module 18 can be applied to the gate terminal of the MOSFET 25 to close the MOSFET 25 to discharge the capacitor 22 and reset the OpAmp integrator 20. It is not essential that this design of OpAmp integrator 20 is used. In other examples different OpAmp integrator designs may be used. In some examples the OpAmp integrator 20 may use an analogue switch instead of the MOSFET 25.

The analogue output voltage CompTh of the operational amplifier 21 of the OpAmp integrator 20 is provided to an inverting input of a comparator 26. The comparator 26 is separate from the FPGA 10.

A current sensor 27 senses the input current flowing into the buck converter 2 from the DC power source 3 and produces an analogue current sense voltage which is supplied to a non-inverting input of the comparator 26. Thus, the analogue output voltage of the OpAmp integrator 20 defined by the controller module 15 of the outer voltage control loop provides a threshold level to the inner current control loop.

When the analogue current sense voltage is lower than the analogue output voltage signal of the OpAmp integrator 20 the output of the comparator 26 remains low, and when the analogue current sense voltage equals or exceeds the analogue output voltage of the OpAmp integrator 20 output the output voltage signal of the comparator 26 becomes high.

The output of the comparator 26 is provided to a blanking module 28 of the FPGA 10. The blanking module 28 operates to temporarily block or blank the output of the comparator 26 for a short period at the start of each cycle of the buck converter 2 in order to remove any spurious high output signals from the comparator 26 due to tripping of the comparator 26 by transient current spikes on switch on of the MOSFET 4 switch of the buck converter 2. At other times the blanking module 28 outputs the output signal of the comparator 26 unchanged.

The output signal from the blanking module 28 is provided to a cycle-by-cycle trip module 29 of the FPGA 10. The trip module 29 identifies the change of state of the output signal of the blanking module 28, from logic HI-to-LO (high to low) or logic LO-to-HI (low to high) as appropriate, depending upon the design of the trip module 29, when the output signal of the comparator 26 becomes high, and sends a signal reporting this to a pulse width modulation (PWM) module 30 of the FPGA 10.

The PWM module 30 responds to the reporting signal from the trip module 29 by sending a gate drive signal to the buck converter 2 which opens the MOSFET 4 switch of the buck converter 2.

In operation of the PCM controller 1, the PCM controller 1 controls the buck converter 2 to operate cyclically at a predetermined frequency, which may be fixed or variable. Each cycle of the buck converter 2 is started by the PWM module 30 sending a gate drive signal to the buck converter 2 which closes the MOSFET 4 switch of the buck converter 2. The PWM module 30 sends these close gate signals at a predetermined frequency and time interval under the control of a clock signal (not show) sent to or generated by the FPGA 10.

At the start of each cycle the blanking module 28 blanks the output signal from the comparator 26 for a predetermined short period. This period may be set on a case-by-case basis in each implementation of the PCM controller 1. Further, at the start of each cycle the slope compensation module 18 stops sending the reset signal to the OpAmp integrator 20 so that the MOSFET 25 opens and the OpAmp integrator 20 can begin integrating.

During each cycle the OpAmp integrator 20 integrates the analogue slope compensation voltage $V_{sc}$ from the second DAC 19, and subtracts the integrated value from the analogue control voltage $V_{th}$ from the first DAC 17 to generate the analogue output voltage CompTh of the operational amplifier 21 of the OpAmp integrator 20. Accordingly, the output of the OpAmp integrator 20 begins each cycle the same as the analogue control voltage $V_{th}$ from the first DAC 17 derived from the scaled digital output values, and then ramps down below the analogue control voltage $V_{th}$ at a rate of slope compensation controlled by the digital slope compensation value from the slope compensation module 18 as the analogue slope compensation voltage Vsc from the second DAC 19 is integrated by charging the capacitor 22.

For each cycle the FPGA 10 calculates an optimum slope compensation value SComp to prevent sub-harmonic oscillation of the buck converter 2, the value of SComp may be expressed in volts per second V/s. The FPAG 10 can calculate an optimum slope compensation value from measured input and output voltage and current data for each complete cycle of the buck converter 2 using known techniques for calculation. In some cases, when appropriate, the calculation of the slope compensation values may also use inductor inductance against current data for the buck converter 2, for example stored in a look up table. Methods of calculating slope compensation values are known to skilled persons in the technical field of the present invention and will not be discussed in detail herein, for clarity.

The analogue output voltage CompTh of the OpAmp integrator 20 is:

$$CompTh = Vth - \int_0^T \frac{Vsc}{Rsc * Csc} dt \qquad \text{equation 1}$$

Where: Vth is the analogue control voltage output by the first DAC 17; Vsc is the analogue slope compensation voltage output by the second DAC 19; Rsc is the resistance of the fourth resistor 24; and Csc is the capacitance of the capacitor 22.

Further, the slope compensation value SComp is related to the analogue slope compensation voltage Vsc of the second DAC 19, by:

$$Vsc = Vth + SComp \cdot Rsc \cdot Csc \qquad \text{equation 2}$$

Accordingly, using equations 1 and 2, once the desired optimum slope compensation value SComp has been calculated the required analogue slope compensation voltage $V_{sc}$, and the corresponding required digital slope compensation value, can be calculated. The calculated digital slope compensation value can then be output by the slope compensation module 18 for the following cycle.

When the analogue current sense voltage equals the analogue output voltage CompTh of the OpAmp integrator 20, the output of the comparator 26 becomes high, and the cycle-by-cycle trip module 29 sends a signal reporting this to the PWM module 30. The PWM module 30 responds by sending a gate drive signal to the buck converter 2 to open the MOSFET 4 switch of the buck converter 2. Further, the slope compensation module 18 also responds by sending the reset signal to the OpAmp integrator 20 to stop integration and reset the OpAmp integrator 20. Thus, the gate drive signal from the PWM module 30 controls the length of time for which the MOSFET 4 switch of the buck converter 2 is closed in each cycle.

For the avoidance of doubt, in the illustrated embodiment of FIG. 1, the control logic of the PCM controller 1 comprises the summer module 13, the reference module 14, the controller module 15, the gain module 16, the slope compensation module 18, the blanking module 28, the trip module 29, and the PWM module 30.

The PCM controller 2 employs two DACs, the first and second DACs 17 and 19, and an OpAmp integrator in place of the summer 111 and the single DAC 112 of the example of FIG. 2. These two DACs can operate at a sampling rate much lower than that required by the single DAC in the FIG. 2 arrangement, when used to provide PCM control of a similar device, such as the buck converters shown in the illustrated examples. Typically, the PCM controller 2 can provide at least equivalent performance to the example of FIG. 2 with the two DACs operating at a sampling rate of up to 100 times slower than the single DAC of FIG. 2.

Further, the comparison of the analogue current sense voltage to the analogue output voltage CompTh of OpAmp integrator 20 in the comparator 26 is a wholly analogue comparison of two analogue signals. Accordingly, the PCM controller 2 will not suffer from any quantisation effects in this comparison, because neither of the compared signals is quantised.

In order to describe and explain the present invention without undue length and complexity the description and figures omit unnecessary detail such as power supplies to the different components, and the like. Such details are well known to the skilled person and do not need to be explained in the present application.

In the embodiment described above the switch of the buck converter 2 is a PMOS MOSFET. This is not essential, and other types of MOSFET, or other types of switch may be used.

In the embodiment described an OpAmp integrator is used. This is not essential, in other examples an alternative analogue differential integrator arrangement may be used.

In the embodiment described above the digital control functionality of the PCM controller is described and illustrated as a number of functional modules. It will be understood that the arrangement of these functional modules does not indicate how the hardware elements providing and/or supporting the digital control functionality are physically arranged.

In the embodiment described above the digital control functionality of the PCM controller is described and illustrated as a number of functional modules. In other examples the modules may be arranged differently and/or have different functions carried out by different modules, or may have the functions of different modules combined, provided that the overall control functionality of a PCM controller is provided.

In the embodiment described above the digital control functionality of the PCM controller comprises a separate gain module to scale control values from a controller module. In other examples the functionality of the gain module may be incorporated into other parts of the control logic, so that the control values from the controller module are correctly scaled without any gain module being required.

In the embodiment described above the digital control functionality of the PCM controller comprises the slope compensation module sending a reset signal to the OpAmp integrator. In other examples the reset signal may be sent by another part of the PCM controller.

In the embodiment described above the digital control functionality of the control logic of the PCM controller is provided by a single FPGA. This is not essential. In other examples this digital control functionality may be provided by multiple FPGAs, and/or by one or more other digital control elements.

In the embodiment described above the PCM controller controls a single buck converter. In other examples the PCM controller may control a plurality of buck converter, or other power supply device topologies.

In the embodiment described above the OpAmp integrator is reset by discharging the capacitor when the trip module 29 detects that the output of the comparator 26 has gone high. In other examples the integrator may be reset later than this, provided that the integrator is reset in time for the integrator to restart at the start of the next cycle.

In the described embodiments of the invention parts of the system may be implemented as a form of a computing and/or electronic device. Such a device may comprise one or more processors which may be microprocessors, controllers or any other suitable type of processors for processing computer executable instructions to control the operation of the device.

Various functions described herein can be implemented in hardware, software, or any combination thereof. If implemented in software, the functions can be stored on or transmitted over as one or more instructions or code on a computer-readable medium. Computer-readable media may include, for example, computer-readable storage media. Computer-readable storage media may include volatile or non-volatile, removable or non-removable media implemented in any method or technology for storage of information such as computer readable instructions, data structures, program modules or other data. A computer-readable storage media can be any available storage media that may be accessed by a computer. By way of example, and not limitation, such computer-readable storage media may comprise RAM, ROM, EEPROM, flash memory or other memory devices, CD-ROM or other optical disc storage, magnetic disc storage or other magnetic storage devices, or any other medium that can be used to carry or store desired program code in the form of instructions or data structures and that can be accessed by a computer. Disc and disk, as used herein, include compact disc (CD), laser disc, optical disc, digital versatile disc (DVD), floppy disk, and blu-ray disc (BD). Further, a propagated signal is not included within the scope of computer-readable storage media. Computer-readable media also includes communication media including any medium that facilitates transfer of a computer program from one place to another. A connection, for instance, can be a communication medium. For example, if the software is transmitted from a website, server, or other remote source using a coaxial cable, fiber optic cable, twisted pair, DSL, or wireless technologies such as infrared, radio, and microwave are included in the definition of communication medium. Combinations of the above should also be included within the scope of computer-readable media.

Alternatively, or in addition, the functionality described herein can be performed, at least in part, by one or more hardware logic components. For example, and without limitation, hardware logic components that can be used may include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), etc.

It will be understood that the benefits and advantages described above may relate to one embodiment or may relate to several embodiments. The embodiments are not limited to those that solve any or all of the stated problems or those that have any or all of the stated benefits and advantages. Variants should be considered to be included into the scope of the invention.

Any reference to 'an' item refers to one or more of those items. The term 'comprising' is used herein to mean including the method steps or elements identified, but that such steps or elements do not comprise an exclusive list and a method or apparatus may contain additional steps or elements.

Further, as used herein, the term "exemplary" is intended to mean "serving as an illustration or example of something".

Further, to the extent that the term "includes" is used in either the detailed description or the claims, such term is intended to be inclusive in a manner similar to the term "comprising" as "comprising" is interpreted when employed as a transitional word in a claim.

The figures illustrate exemplary methods. While the methods are shown and described as being a series of acts that are performed in a particular sequence, it is to be understood and appreciated that the methods are not limited by the order of the sequence. For example, some acts can occur in a different order than what is described herein. In addition, an act can occur concurrently with another act. Further, in some instances, not all acts may be required to implement a method described herein.

The order of the steps of the methods described herein is exemplary, but the steps may be carried out in any suitable order, or simultaneously where appropriate. Additionally, steps may be added or substituted in, or individual steps may be deleted from any of the methods without departing from the scope of the subject matter described herein. Aspects of any of the examples described above may be combined with aspects of any of the other examples described to form further examples without losing the effect sought.

It will be understood that the above description of a preferred embodiment is given by way of example only and that various modifications may be made by those skilled in the art. What has been described above includes examples of one or more embodiments. It is, of course, not possible to describe every conceivable modification and alteration of the above devices or methods for purposes of describing the aforementioned aspects, but one of ordinary skill in the art can recognize that many further modifications and permutations of various aspects are possible. Accordingly, the described aspects are intended to embrace all such alterations, modifications, and variations that fall within the scope of the appended claims.

What is claimed is:

1. A peak current mode 'PCM' controller comprising: control logic arranged to produce a series of digital control values derived from a voltage sense signal; control logic arranged to produce a digital slope compensation value; a first digital to analogue converter 'DAC' arranged to receive the series of digital control values and output a corresponding analogue control voltage; a second DAC arranged to receive the digital slope compensation value and output a corresponding analogue slope compensation voltage; an analogue differential integrator arranged to: receive the analogue control voltage and the analogue slope compensation voltage; integrate the analogue slope compensation voltage; subtract the integrated slope compensation voltage from the analogue control voltage; and output a result of the subtraction as an analogue output voltage; a comparator arranged to compare the analogue output voltage to a voltage of an analogue current sense signal and produce an output signal when the analogue current sense signal voltage is equal to or exceeds the analogue output voltage; and control logic arranged to produce a drive signal in response to the output signal.

2. The controller as claimed in claim 1, wherein the control logic is defined by at least one digital processor; and the first DAC, the second DAC, and the analogue differential integrator are separate from the at least one digital processor.

3. The controller as claimed in claim 2, wherein the comparator is separate from the at least one digital processor.

4. The controller as claimed in claim 2, wherein the controller further comprises an analogue to digital converter 'ADC' arranged to receive an analogue voltage sense signal and output corresponding digital voltage sense signal values to the control logic.

5. The controller as claimed in claim 4, wherein the ADC is separate from the at least one digital processor.

6. The controller as claimed in claim 2, wherein the at least one digital processor comprises at least one field programmable gate array 'FPGA'.

7. The controller as claimed in claim 1, wherein the control logic is arranged to form a dual loop control system in which the voltage sense signal is used in an outer voltage control loop, the current sense signal is used in an inner current control loop, the first DAC, second DAC and the analogue differential integrator are part of the outer voltage control loop, and the output voltage of the analogue differential integrator provides a threshold level to the inner current control loop.

8. The controller as claimed in claim 4, the control logic comprising: a reference module arranged to provide a reference value; a summer module arranged to subtract the reference value from each of the series of digital voltage sense signal values to produce a series of digital error values; a controller module arranged to use the series of digital error values to produce the series of digital control values; and a slope compensation module arranged to produce the digital slope compensation value.

9. The controller as claimed in claim 8, wherein the control logic further comprises a gain module arranged to scale the digital control values before they are provided to the first DAC.

10. The controller as claimed in claim 1, the control logic comprising: a blanking module arranged to blank the output signal of the comparator for a predetermined period; a trip module arranged to detect the output signal from the comparator; and a pulse width modulation 'PWM' module arranged to produce the drive signal in response to detection of the output signal by the trip module.

11. A power supply system comprising a power supply device and a peak current mode 'PCM' controller, the power supply device comprising a switch; and the peak current mode 'PCM' controller comprising: control logic arranged to produce a series of digital control values derived from a voltage sense signal corresponding to an output voltage of the power supply device; control logic arranged to produce a digital slope compensation value; a first digital to analogue converter 'DAC' arranged to receive the series of digital control values and output a corresponding analogue control voltage; a second DAC arranged to receive the digital slope compensation value and output a corresponding analogue slope compensation voltage; an analogue differential integrator arranged to: receive the analogue control voltage and the analogue slope compensation voltage; integrate the analogue slope compensation voltage; subtract the integrated slope compensation voltage from the analogue control voltage; and output a result of the subtraction as an analogue output voltage; a comparator arranged to compare the analogue output voltage to a voltage of an analogue current sense signal corresponding to an input current of the power supply device and produce an output signal when the analogue current sense signal voltage is equal to or exceeds the analogue output voltage; and control logic arranged to produce a drive signal opening the switch in response to the output signal.

12. The system of claim 11, wherein the control logic is further arranged to produce a drive signal closing the switch at a predetermined frequency.

13. The system of claim 11, wherein the power supply device comprises a switched mode power supply or power converter.

14. The system of claim 13, wherein the power supply device comprises at least one of: a buck converter; a boost converter; a buck-boost converter; a push-pull converter; a flyback converter; or a forward converter.

15. The system as claimed in claim 11, wherein the control logic is defined by at least one digital processor; and the first DAC, the second DAC, and the analogue differential integrator are separate from the at least one digital processor.

16. The system as claimed in claim 15, wherein the comparator is separate from the at least one digital processor.

17. The system as claimed in claim 15, wherein the controller further comprises an analogue to digital converter 'ADC' arranged to receive an analogue voltage sense signal and output corresponding digital voltage sense signal values to the control logic.

18. The system as claimed in claim 17, wherein the ADC is separate from the at least one digital processor.

19. The system as claimed in claim 15, wherein the at least one digital processor comprises at least one field programmable gate array 'FPGA'.

20. The system as claimed in claim 11, wherein the control logic is arranged to form a dual loop control system in which the voltage sense signal is used in an outer voltage control loop, the current sense signal is used in an inner current control loop, the first DAC, second DAC and the analogue differential integrator are part of the outer voltage control loop, and the output voltage of the analogue differential integrator provides a threshold level to the inner current control loop.

21. The system as claimed in claim 16, the control logic comprising: a reference module arranged to provide a reference value; a summer module arranged to subtract the reference value from each of the series of digital voltage sense signal values to produce a series of digital error values; a controller module arranged to use the series of digital error values to produce the series of digital control values; and a slope compensation module arranged to produce the digital slope compensation value.

22. The system as claimed in claim 21, wherein the control logic further comprises a gain module arranged to scale the digital control values before they are provided to the first DAC.

23. The system as claimed in claim 11, the control logic comprising: a blanking module arranged to blank the output signal of the comparator for a predetermined period; a trip module arranged to detect the output signal from the comparator; and a pulse width modulation 'PWM' module arranged to produce the drive signal in response to detection of the output signal by the trip module.

24. A method of operating a peak current mode 'PCM' controller, the method comprising: producing a series of digital control values derived from a voltage sense signal by a control logic; producing a digital slope compensation value by a control logic; receiving the series of digital control values at a first digital to analogue converter 'DAC' and outputting a corresponding analogue control voltage from the first DAC; receiving the digital slope compensation value at a second DAC and outputting a corresponding analogue slope compensation voltage from the second DAC; receiving the analogue control voltage and the analogue slope compensation voltage at an analogue differential integrator; the analogue differential integrator integrating the analogue slope compensation voltage; the analogue differential integrator subtracting the integrated slope compensation voltage from the analogue control voltage; and the analogue differential integrator outputting a result of the subtraction as an analogue output voltage; comparing the analogue output voltage to a voltage of an analogue current sense signal at a comparator and producing an output signal when the analogue current sense signal voltage is equal to or exceeds the analogue output voltage; and producing a drive signal by a control logic in response to the output signal.

25. The method as claimed in claim 24, wherein the control logic is defined by at least one digital processor; and the first DAC, the second DAC, and the analogue differential integrator are separate from the at least one digital processor.

26. The method as claimed in claim 25, wherein the comparator is separate from the at least one digital processor.

27. The method as claimed in claim 25, further comprising receiving an analogue voltage sense signal at an analogue to digital converter 'ADC', and outputting corresponding digital voltage sense signal values to the control logic.

28. The method as claimed in claim 27, wherein the ADC is separate from the at least one digital processor.

29. The method as claimed in claim 25, wherein the at least one digital processor comprises at least one field programmable gate array 'FPGA'.

30. The method as claimed in claim 24, wherein the control logic is arranged to carry out dual loop control in which the voltage sense signal is used in an outer voltage control loop, the current sense signal is used in an inner current control loop, the first DAC, second DAC and the analogue differential integrator are part of the outer voltage control loop, and the output voltage of the analogue differential integrator provides a threshold level to the inner current control loop.

31. The method as claimed in claim 27, the method further comprising: a reference module of the control logic providing a reference value; a summer module of the control logic subtracting the reference value from each of the series of digital voltage sense signal values to produce a series of digital error values; a controller module of the control logic using the series of digital error values to produce the series of digital control values; and a slope compensation module of the control logic producing the digital slope compensation value.

32. The method as claimed in claim 31, the method further comprising a gain module of the control logic scaling the digital control values before they are provided to the first DAC.

33. The method as claimed in claim 24, the method further comprising: a blanking module of the control logic blanking the output signal of the comparator for a predetermined period; a trip module of the control logic detecting the output signal from the comparator; and a pulse width modulation 'PWM' module of the control logic producing the drive signal in response to detection of the output signal by the trip module.

* * * * *